(12) United States Patent
Tsukitani et al.

(10) Patent No.: US 8,764,223 B2
(45) Date of Patent: Jul. 1, 2014

(54) LIGHTING DEVICE

(71) Applicant: Panasonic Corporation, Osaka (JP)

(72) Inventors: Ayako Tsukitani, Kyoto (JP); Takashi Saito, Osaka (JP); Akira Takashima, Hyoga (JP); Kouichi Wada, Osaka (JP); Yoshinori Karasawa, Osaka (JP); Toshihide Mori, Osaka (JP); Hiroshi Hamano, Hyogo (JM); Kensuke Yamazoe, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/869,445

(22) Filed: Apr. 24, 2013

(65) Prior Publication Data

US 2013/0299851 A1    Nov. 14, 2013

(30) Foreign Application Priority Data

May 11, 2012   (JP) ................. 2012-109390

(51) Int. Cl.

| | | |
|---|---|---|
| *F21V 21/002* | (2006.01) | |
| *F21V 9/00* | (2006.01) | |
| *F21S 4/00* | (2006.01) | |
| *F21S 8/10* | (2006.01) | |
| *H01L 33/48* | (2010.01) | |
| *H01L 33/58* | (2010.01) | |

(52) U.S. Cl.
CPC .............. *F21V 9/00* (2013.01); *F21S 48/115* (2013.01); *F21S 48/1154* (2013.01); *H01L 33/48* (2013.01); *H01L 33/58* (2013.01)
USPC .......... 362/230; 362/227; 362/231; 362/235; 362/294; 315/297; 257/88; 257/98; 257/E23.069; 257/E23.067

(58) Field of Classification Search
CPC ...... F21V 9/00; F21S 48/115; F21S 48/1154; H01L 33/48; H01L 33/58
USPC .......... 362/227, 230, 231, 235, 294; 315/297; 257/88, 98, E23.069, E23.067
See application file for complete search history.

(56) References Cited

U.S. PATENT DOCUMENTS

| 6,406,172 B1 | 6/2002 | Harbers et al. |
|---|---|---|
| 7,628,508 B2 | 12/2009 | Kita et al. |

(Continued)

FOREIGN PATENT DOCUMENTS

| JP | 09-120797 | 5/1997 |
|---|---|---|
| JP | 2008-091232 | 4/2008 |

(Continued)

OTHER PUBLICATIONS

John F. Van Derlofske et al., "White Led sources for vehicle forward lighting", Proceedings of SPIE, vol. 4776, 2002, XP002711232, , pp. 195-205.

(Continued)

*Primary Examiner* — Dao H Nguyen
(74) *Attorney, Agent, or Firm* — Greenblum & Bernstein, P.L.C.

(57) ABSTRACT

A lighting device includes first and second light emission units. The first light emission unit emits light having a relatively low color temperature and a high feeling of contrast index. The second light emission unit emits light having a relatively high S/P ratio, which is the ratio of scotopic luminance to photopic luminance. The first light emission unit illuminates a region located at a vertical upper side of a region illuminated by the second light emission unit.

5 Claims, 4 Drawing Sheets

(56) References Cited

U.S. PATENT DOCUMENTS

| | | | |
|---|---|---|---|
| 8,388,174 B2* | 3/2013 | Rooymans | 362/231 |
| 2003/0156425 A1 | 8/2003 | Turnbull et al. | |
| 2008/0080178 A1 | 4/2008 | Kita et al. | |
| 2009/0302343 A1 | 12/2009 | Sato et al. | |
| 2010/0237766 A1* | 9/2010 | Baumgartner et al. | 313/498 |
| 2012/0015444 A1* | 1/2012 | Mazumdar et al. | 436/169 |
| 2012/0087115 A1* | 4/2012 | Maxik | 362/231 |
| 2012/0268927 A1* | 10/2012 | Saito et al. | 362/227 |
| 2012/0287618 A1* | 11/2012 | Saito | 362/230 |

FOREIGN PATENT DOCUMENTS

| | | |
|---|---|---|
| JP | 2010-539689 | 12/2010 |
| JP | 2011-009059 | 1/2011 |
| JP | 2011-175802 | 9/2011 |
| WO | 01/01038 | 1/2001 |
| WO | 2009/033642 | 3/2009 |

OTHER PUBLICATIONS

Search report from E.P.O., mail date is Aug. 23, 2013.

* cited by examiner

Fig.3
|  | Tc | FCI | S/P Ratio |
|---|---|---|---|
| 1st Light Emission Unit | 2900K | 145 | 1.5 |
| 2nd Light Emission Unit | 7900K | 85 | 2.1 |
| High Color Rendering Light Bulb Color LED | 2800K | 118 | 1.3 |
Fig.4
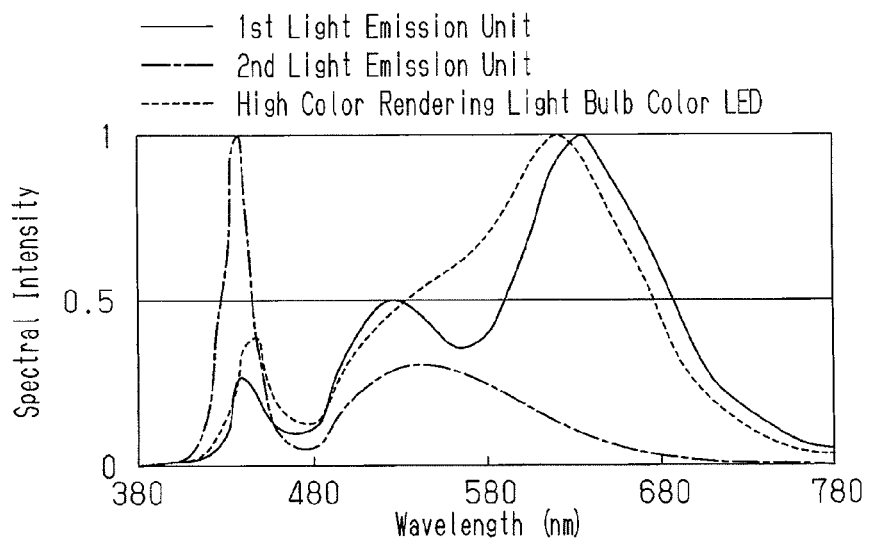
Fig.5
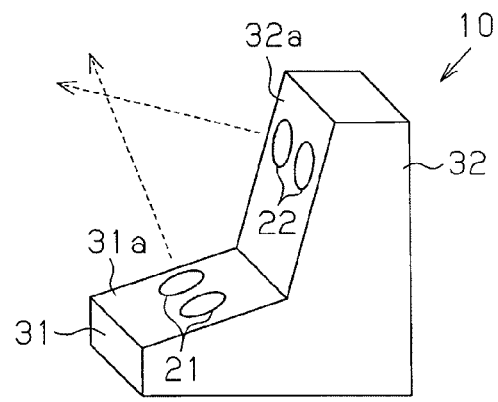

Fig.9
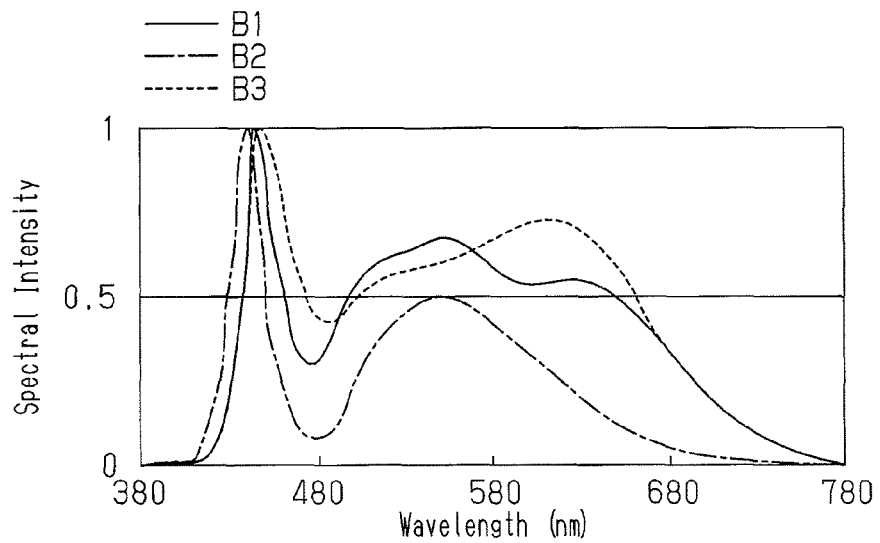
Fig.10
| | Configuration | Tc | FCI | S/P Ratio |
|---|---|---|---|---|
| 1st Light Emission Unit | A1 | 2800 | 136 | 1.3 |
| | A2 | 2600 | 145 | 1.5 |
| | A3 | 2600 | 130 | 1.3 |
| 2nd Light Emission Unit | B1 | 5200 | 103 | 2.1 |
| | B2 | 6400 | 82 | 2.0 |
| | B3 | 4500 | 112 | 2.0 |
Fig.11
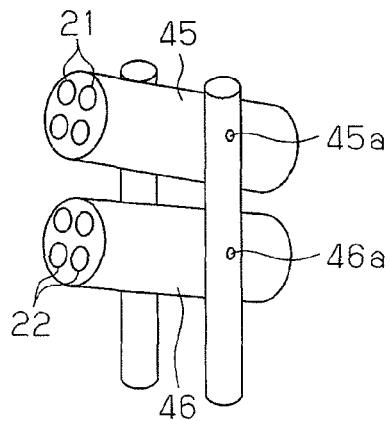

LIGHTING DEVICE

CROSS-REFERENCE TO RELATED APPLICATIONS

This application is based upon and claims the benefit of priority from prior Japanese Patent Application No. 2012-109390, filed on May 11, 2012, the entire contents of which are incorporated herein by reference.

BACKGROUND OF THE INVENTION

The present invention relates to a lighting device.

Lighting devices, such as a fluorescent lamp and a light emitting diode (LED), are generally designed to increase the photopic luminance for photopic vision under well-lit conditions. The human eye uses cone cells to sense brightness for photopic vision. Thus, a higher photopic luminance increases the sensitivity of the human eye to light.

However, for mesopic vision used in nighttime street and road scenarios, the human eye uses rod cells in addition to cone cells. The peak value of the spectral luminous efficiency for cone cells is 555 nm, whereas the peak value of the spectral luminous efficiency for rod cells is 507 nm. Thus, an increase in only the photopic luminance would not be effective. Such a shift in the spectral luminous efficiency is known as the Purkinje effect.

Japanese Laid-Open Patent Publication No. 2008-91232 describes an example of a lighting device that takes into consideration that the cone cells and the rod cells in the human retina both function under mesopic vision situations. The lighting device includes a plurality of light sources so that the cone cells and the rod cells are both able to function. At least one of the light sources emits light having a peak value in a wavelength band from between 450 to 550 nm, which includes 507 nm that is the peak wavelength of the spectral luminous efficiency for rod cells.

The lighting device takes into consideration the Purkinje effect and relatively increases the short wavelength components of visible light in the spectral distribution of the light source. This increases brightness sensitivity under mesopic vision situations. However, when plants, such as street trees, are illuminated with light adjusted to conform to mesopic vision situations, green leaves would appear bluish and unnatural. This would not be scenic.

SUMMARY OF THE INVENTION

One aspect of the present invention is a lighting device that includes first and second light emission units. The first light emission unit emits light having a relatively low color temperature and a high feeling of contrast index. The second light emission unit emits light having a relatively high S/P ratio, which is the ratio of scotopic luminance to photopic luminance. The first light emission unit illuminates a region located at a vertical upper side of a region illuminated by the second light emission unit.

BRIEF DESCRIPTION OF THE DRAWINGS

The invention, together with objects and advantages thereof, may best be understood by reference to the following description of the presently preferred embodiments together with the accompanying drawings in which:

FIG. 3 is a table showing the spectral characteristics of the first and second light emission units in the lighting device of FIG. 1A and the spectral characteristics of a light source in a comparative example;

FIG. 4 is a graph showing the spectral characteristics of the first and second light emission units in the lighting device of FIG. 1A and the spectral characteristics of the light source in the comparative example;

FIG. 5 is a schematic diagram showing a lighting device according to a further embodiment of the present invention;

FIG. 9 is a graph showing the spectral characteristics of a second emission unit in a lighting device according to a further embodiment of the present invention;

FIG. 10 is a table showing the spectral characteristics of first and second light emission units in a lighting device according to a further embodiment of the present invention; and FIG. 11 is a schematic diagram showing a lighting device according to a further embodiment of the present invention.

DETAILED DESCRIPTION OF THE INVENTION

A lighting device according to one embodiment of the present invention will now be described with reference to the drawings.

Figure 1A:
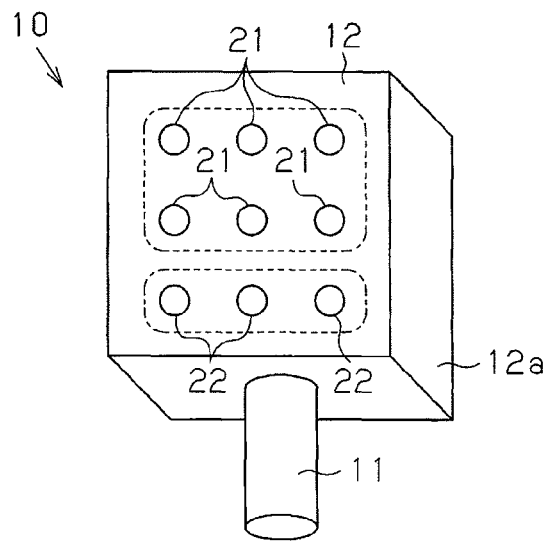
FIG. 1A is a schematic diagram of a lighting device according to one embodiment of the present invention.

As shown in FIG. 1A, a lighting device 10 of the present invention includes a cylindrical pole 11 and a main body 12. A portion of the pole 11 is buried in the ground. The main body 12 is coupled to one end of the pole 11. The main body 12 includes a housing 12a, a plurality of (for example, six) first light emission units 21, and a plurality of (for example, three) second light emission units 22. The main body 12 is configured to emit light from a lower position than a human H and a street tree T.

Figure 2A:
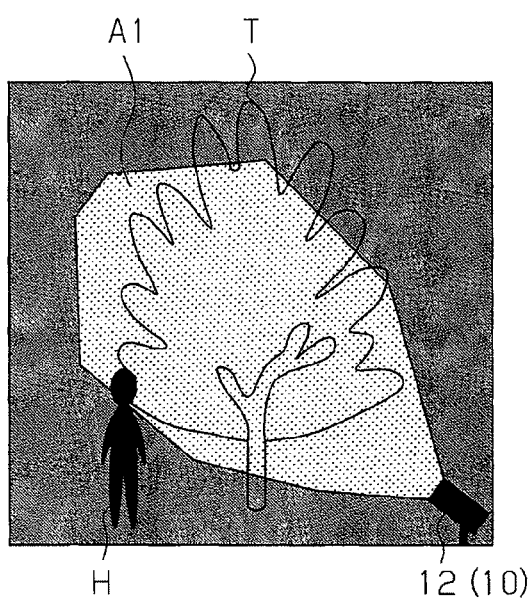
FIG. 2A is a diagram showing the operation of the lighting device.
Figure 2B:
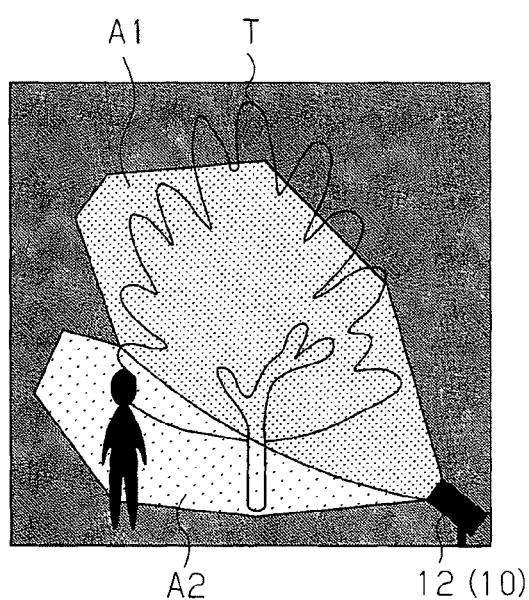
FIG. 2B is a diagram showing the operation of the lighting device.

The first light emission units 21 are arranged at a vertical upper side of the second light emission units 22 arranged in the housing 12a. Thus, as shown in FIGS. 2A and 2B, the first light emission units 21, which are located at the vertical upper side of the second light emission units 22, illuminate a vertical upper area A1. The second light emission units 22, which are located below the first light emission units 21, illuminate a lower area A2. The upper area A1 is a region suitable for the illumination of the leaves of the street tree T that are higher than the human H and separated by a predetermined distance from the lighting device 10. The lower area A2 is a region suitable for the illumination of the height of the human H and lower.

Figure 1B:
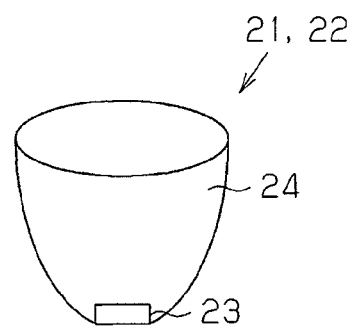
FIG. 1B is a schematic diagram showing first and second light emission units of the lighting device shown in FIG. 1.

As shown in FIG. 1B, the first light emission units 21 and the second light emission units 22 each include an LED element 23 and a bowl-shaped condenser lens 24. The LED element 23 of the first light emission unit 21 has a spectral distribution (spectral characteristic) that differs from that of the LED element 23 of the second light emission unit 22.

Referring to FIG. 3, the first light emission unit 21 emits light having a color temperature Tc of approximately 2900 K, a feeling of contrast index (FCI) of 145, and an S/P ratio of 1.5. The solid line in FIG. 4 shows the spectral characteristic of the light emitted from the first light emission unit 21. Further, referring to FIG. 3, the second light emission unit 22 emits light having a color temperature Tc of approximately 7900 K, an FCI of 85, and an S/P ratio of 2.1. The single-dashed line in FIG. 4 shows the spectral characteristic of the light emitted from the second light emission unit 22.

The FCI may be expressed by the equation shown below. Here, $G_{LAB}(T)$ represents the color gamut area of a color combination sample for the four colors of red, blue, green, and yellow in LAB coordinates under a test light source, and $G_{LAB}(D65)$ represents the color gamut area of the four-color combination sample in LAB coordinates under a reference light source (6500 K).

$$FCI = \left[\frac{G_{LAB}(T)}{G_{LAB}(D65)}\right]^{1.5} \times 100 \qquad \text{Equation 1}$$

Further, the S/P ratio is a performance evaluation index of visibility under a mesopic vision situation. The S/P ratio may be calculated from the equation shown below. Here, Ls represents the scotopic luminance, Lp represents the photopic luminance, $S(\lambda)$ represents the spectral radiant intensity of the light source, $V(\lambda)$ represents the spectral luminous efficiency under a photopic vision situation, and $V'(\lambda)$ represents the spectral luminous efficiency under a mesopic vision situation.

$$S/P \text{ ratio} = \frac{Ls}{Lp} \qquad \text{Equation 2}$$
$$Ls = \int S(\lambda) * V'(\lambda) d\lambda$$
where
$$Lp = \int S(\lambda) * V(\lambda) d\lambda$$

The operation of the lighting device will now be described.

When supplied with power from a power supply (not shown), the lighting device 10 activates the first light emission units 21 and the second light emission units 22.

The first light emission units 21 are arranged at the vertical upper side of the second light emission units 22. Thus, the first light emission units 21 emit light that illuminates the upper area A1, and the second light emission units 22 emit light that illuminates the lower area A2 (refer to FIGS. 2A and 2B). The upper area A1 is located at the vertical upper side of the lower area A2. The light from the first light emission units 21 has a higher FCI than a high color rendering light bulb color LED having about the same color temperature that is shown in FIGS. 3 and 4. This allows the leaves of the street tree T located in the upper area A1 to have a vivid appearance.

The light emitted from the second light emission units 22 illuminates the lower area A2, which is located at a vertical lower side of the upper area A1 illuminated by the light from the first light emission units 21. Further, the light from the second light emission units 22 has a higher S/P ratio than the light from a high color rendering light bulb color LED. This increases the brightness sensitivity of the human eye at the lower side of the street tree T, which is in a mesopic vision situation, and ensures that visibility is obtained.

The above embodiment has the advantages described below.

(1) The lighting device 10 of the present embodiment includes the first light emission units 21, which emit light having a relatively low color temperature and a high FCI, and the second light emission units 22, which emit light having a relatively high S/P ratio that is the ratio of the scotopic luminance to the photopic luminance. The first light emission units 21 are configured to illuminate a region (area A1) at the upper side of a region (area A2) illuminated by the second light emission units 22. The first light emission units 21 illuminate the upper region with light having a low color temperature and a high FCI. This allows the street tree T and its leaves to have a vivid appearance. Further, the second light emission units 22 illuminate the lower region with light having a high S/P ratio. This increases the brightness sensitivity and visibility even in a mesopic vision situation in the vicinity of the street tree T.

(2) The color temperature of the light from the first light emission units 21 is lower than the center value of 4150 K for the color of white (3800 to 4500 K) as specified by JIS Z9112. Further, the FCI of the light from the first light emission units 21 is higher than the FCI (123) of an incandescent lamp. The S/P ratio of the light from the second light emission units 22 is 2.1. This increases the brightness sensitivity under a mesopic vision situation.

The present embodiment may be modified as described below.

In the above embodiment, although not particularly described, for example, the first light emission units 21 and the second light emission units 22 may emit light in different directions so that the first light emission units 21 illuminate a region at the upper side of the region illuminated by the second light emission units 22. Examples of such structures will now be given.

Referring to FIG. 5, the lighting device 10 includes a lower housing 31 and an upper housing 32, which is formed integrally with the lower housing 31. The lower housing 31 accommodates the first light emission units 21 and includes an upper surface 31a from which the light of the first light emission units 21 is emitted. The upper housing 32 accommodates the second light emission units 22 and includes a front surface 32a from which the light of the second light emission units 22 is emitted. The light emitted from the first light emission units 21 intersects with the light from the second light emission units 22. Then, the light from the first light emission units 21 illuminates the leaves of the street tree T and the like (area A1), and the light from the second light emission units 22 illuminates the lower side of the street tree T (area A2).

Figure 6:
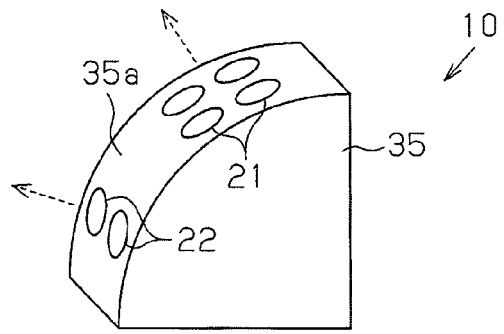
FIG. 6 is a schematic diagram showing a lighting device according to a further embodiment of the present invention.

Referring to FIG. 6, the lighting device 10 includes a housing 35 having a curved front surface 35a. The housing 35 accommodates the first light emission units 21 and the second light emission units 22. The first light emission units 21 emit light in a vertical upper direction from the upper side of the front surface 35a. The second light emission units 22 emit light from a lower side of the front surface 35a of the housing 35 toward a region below the region illuminated by the first light emission units 21 and in a rather horizontal direction.

Figure 7:
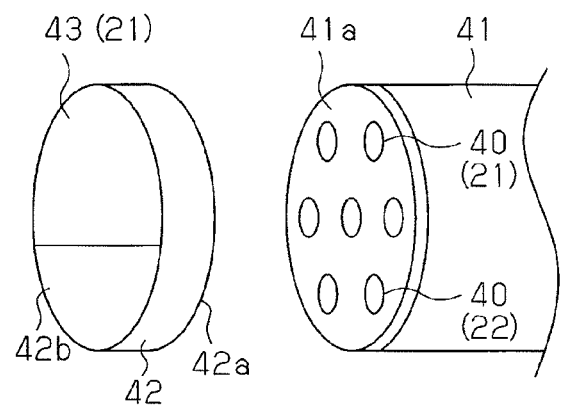
FIG. 7 is a schematic diagram showing a lighting device according to a further embodiment of the present invention.

In the above embodiment, although not particularly described, for example, as shown in FIG. 7, the first light emission units 21 and the second light emission units 22 may be formed by a plurality of LED elements 40 having the same spectral distribution (spectral characteristic). The LED elements 40 are arranged on a front surface 41a of a cylindrical housing 41. A transparent disk 42 (transparent member) entirely covers the LED elements 40. The transparent disk 42 has a rear surface 42a that contacts the front surface 41a. A filter 43 is arranged on a vertical upper side of a front surface 42b of the transparent disk 42. The filter 43 contains a substance that absorbs light in the wavelength band around, for example, 570 nm (between green and yellow). The LED elements 40 that emit light along a path including the filter 43 form the first light emission units 21. Further, the LED elements 40 that emit light along a path separated from the filter 43 form the second light emission units 22. In this manner, a first light emission unit 21 includes at least one first LED element 40 and the filter 43, which is arranged in the path of the light emitted from the first LED element 40, and a second light emission unit 22 includes at least one second LED element 40 having the same spectral characteristic as the first LED element 40.

Figure 8:
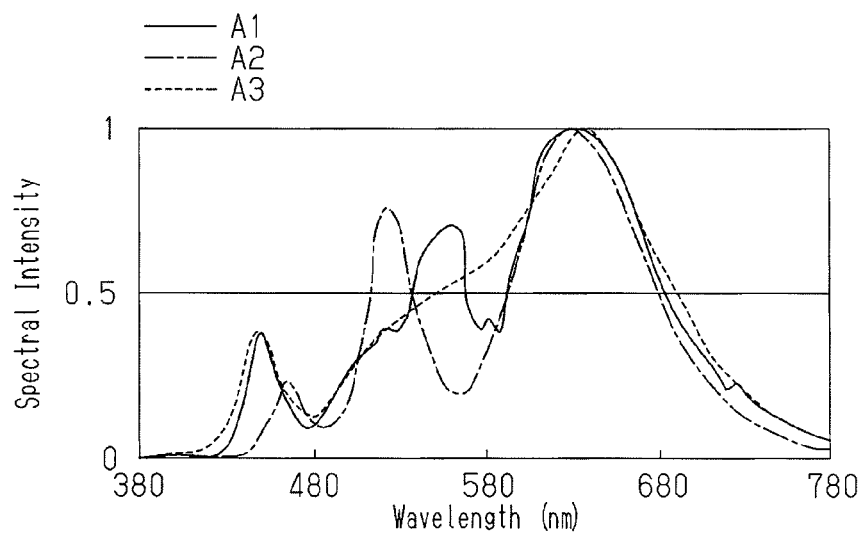
FIG. 8 is a graph showing the spectral characteristics of a first emission unit in a lighting device according to a further embodiment of the present invention.

In the above embodiment, the configurations of A1 to A3 illustrated in FIGS. 8 and 10 may be used as the first light emission units 21.

Configuration A1

Combination of a high color rendering light bulb color LED and a neodymium glass filter that absorbs light in the wavelength band around 570 nm.

Configuration A2

Combination of a gallium nitride blue LED, a gallium nitride green LED, and a SCASN red fluorescent body.

Configuration A3

Combination of a high color rendering light bulb color LED and an AlInGa red LED.

Further, the configurations of B1 to B3 illustrated in FIGS. 9 and 10 may be used as the second light emission units 22.

Configuration B1

Combination of a gallium nitride blue LED and a YAG yellow fluorescent body.

Configuration B2

Combination of a gallium nitride blue LED, a CASN red fluorescent body, and a BOSE green fluorescent body.

Configuration B3

Combination of a gallium nitride blue LED and a YAG yellow fluorescent body.

In the above embodiment, the first light emission units 21 and the second light emission units 22 are arranged in a single housing 12a. Instead, as shown in FIG. 11, the first light emission units 21 and the second light emission units 22 may be arranged in separate housings 45 and 46.

In the above embodiment, although not particularly described, the lighting device may include, for example, an illumination position changing means, that allows for a change in the direction light is emitted from the first light emission units 21 and the second light emission units 22. That is, the lighting device may be pivotal. As shown in FIG. 11, the housing 45, which includes the first light emission units 21, is pivotal about a pivot shaft 45a, and may be fixed at a certain position by a stopper (not shown). Further, the housing 46, which includes the second light emission units 22, is pivotal about a pivot shaft 46a, and may be fixed at a certain position by a stopper (not shown). The first light emission units 21 are pivotal at the upper side of the second light emission units 22. The second light emission units 22 are pivotal at the lower side of the first light emission units 21.

In this manner, a lighting device according to a further embodiment of the present invention includes an illumination position changing means for changing an illumination position of at least one of a first light emission unit and a second light emission unit without changing an order in which a region illuminated by the first light emission unit and a region illuminated by the second light emission unit are arranged in a vertical direction.

This allows the position illuminated by either one of the first light emission unit and the second light emission unit to be changed.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:

1. A lighting device comprising:
   a first light emission unit that emits light having a relatively low color temperature and a high feeling of contrast index; and
   a second light emission unit that emits light having a relatively high S/P ratio, which is the ratio of scotopic luminance to photopic luminance,
   wherein the first light emission unit illuminates a region located at a vertical upper side of a region illuminated by the second light emission unit.

2. The lighting device according to claim 1, wherein
   the first light emission unit is configured to emit light having a color temperature that is 4150 K or less and a feeling of contrast index that is greater than 123, and
   the second light emission unit is configured to emit light having an S/P ratio that is 2.1 or greater.

3. The lighting device according to claim 2, wherein the first light emission unit includes
   at least one first LED element, and
   a filter arranged in a path of light emitted from the at least one first LED element.

4. The lighting device according to claim 3, wherein the second light emission unit includes at least one second LED element having a spectral characteristic that is the same as the first LED element.

5. The lighting device according to claim 3, wherein the filter contains a substance that absorbs light in a wavelength band around 570 nm.

* * * * *